(12) United States Patent
Yeong et al.

(10) Patent No.: US 11,854,907 B2
(45) Date of Patent: *Dec. 26, 2023

(54) CONTACT AIR GAP FORMATION AND STRUCTURES THEREOF

(71) Applicant: Taiwan Semiconductor Manufacturing Co., Ltd., Hsinchu (TW)

(72) Inventors: Sai-Hooi Yeong, Hsinchu County (TW); Kai-Hsuan Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 340 days.

This patent is subject to a terminal disclaimer.

(21) Appl. No.: 17/222,739

(22) Filed: Apr. 5, 2021

(65) Prior Publication Data
US 2021/0225713 A1    Jul. 22, 2021

Related U.S. Application Data

(63) Continuation of application No. 16/595,212, filed on Oct. 7, 2019, now Pat. No. 10,971,408.
(Continued)

(51) Int. Cl.
*H01L 21/8238*  (2006.01)
*H01L 29/78*  (2006.01)
(Continued)

(52) U.S. Cl.
CPC .. *H01L 21/823871* (2013.01); *H01L 21/7682* (2013.01); *H01L 21/76897* (2013.01);
(Continued)

(58) Field of Classification Search
CPC ......... H01L 21/823871; H01L 21/7682; H01L 21/76897; H01L 21/823814; H01L 21/823821; H01L 27/0924; H01L 29/0847; H01L 29/66795; H01L 29/7851; H01L 2221/1063; H01L 21/823425;
(Continued)

(56) References Cited

U.S. PATENT DOCUMENTS 8,772,109 B2   7/2014   Colinge
8,785,285 B2   7/2014   Tsai et al.
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

A method of forming a device includes providing a transistor having a gate structure and a source/drain structure adjacent to the gate structure. A cavity is formed along a sidewall surface of a contact opening over the source/drain structure. After forming the cavity, a sacrificial layer is deposited over a bottom surface and along the sidewall surface of the contact opening including within the cavity. A first portion of the sacrificial layer along the bottom surface of the contact opening is removed to expose a portion of the source/drain structure. A metal plug is then formed over the portion of the exposed source/drain structure. A remaining portion of the sacrificial layer is removed to form an air gap disposed between the metal plug and the gate structure. Thereafter, a seal layer is deposited over the air gap to form an air gap spacer.

20 Claims, 8 Drawing Sheets

Related U.S. Application Data

(60) Provisional application No. 62/753,561, filed on Oct. 31, 2018.

(51) Int. Cl.
*H01L 29/66* (2006.01)
*H01L 29/08* (2006.01)
*H01L 21/768* (2006.01)
*H01L 27/092* (2006.01)

(52) U.S. Cl.
CPC ............... *H01L 21/823814* (2013.01); *H01L 21/823821* (2013.01); *H01L 27/0924* (2013.01); *H01L 29/0847* (2013.01); *H01L 29/66795* (2013.01); *H01L 29/7851* (2013.01)

(58) Field of Classification Search
CPC ......... H01L 21/823475; H01L 29/0653; H01L 29/4991; H01L 29/785; H01L 27/088; H01L 29/78; H01L 29/0649; H01L 29/66477
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,608,065 B1 * | 3/2017 | Bergendahl ......... H01L 29/6656 |
| 2017/0018464 A1 | 1/2017 | Kim et al. |

* cited by examiner ically prior to) contact plug formation, so that the air gaps are not exposed to contact hole etching processes and therefore not filled by a subsequent nitride liner.

CONTACT AIR GAP FORMATION AND STRUCTURES THEREOF

PRIORITY DATA

This application is a continuation of U.S. patent application Ser. No. 16/595,212, filed Oct. 7, 2019, issuing as U.S. Pat. No. 10,971,408, which claims the benefit of U.S. Provisional Application No. 62/753,561, filed Oct. 31, 2018, the disclosures of which are hereby incorporated by reference in their entirety.

BACKGROUND

The electronics industry has experienced an ever-increasing demand for smaller and faster semiconductor devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, as device geometry shrinks, coupling capacitance tends to increase between interconnects such as source/drain (S/D) contact plugs and nearby gates. The increased coupling capacitance degrades device performance. To lower such coupling capacitance, insulating materials with a relatively low dielectric constant (k), such as low-k dielectrics and air gaps, have been used between S/D features and nearby gates. However, these materials have proven difficult to fabricate. In some instances, low-k dielectric materials are brittle, unstable, difficult to deposit, or sensitive to processes such as etching, annealing, and polishing, and air gap formations are difficult to control.

Thus, existing techniques have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
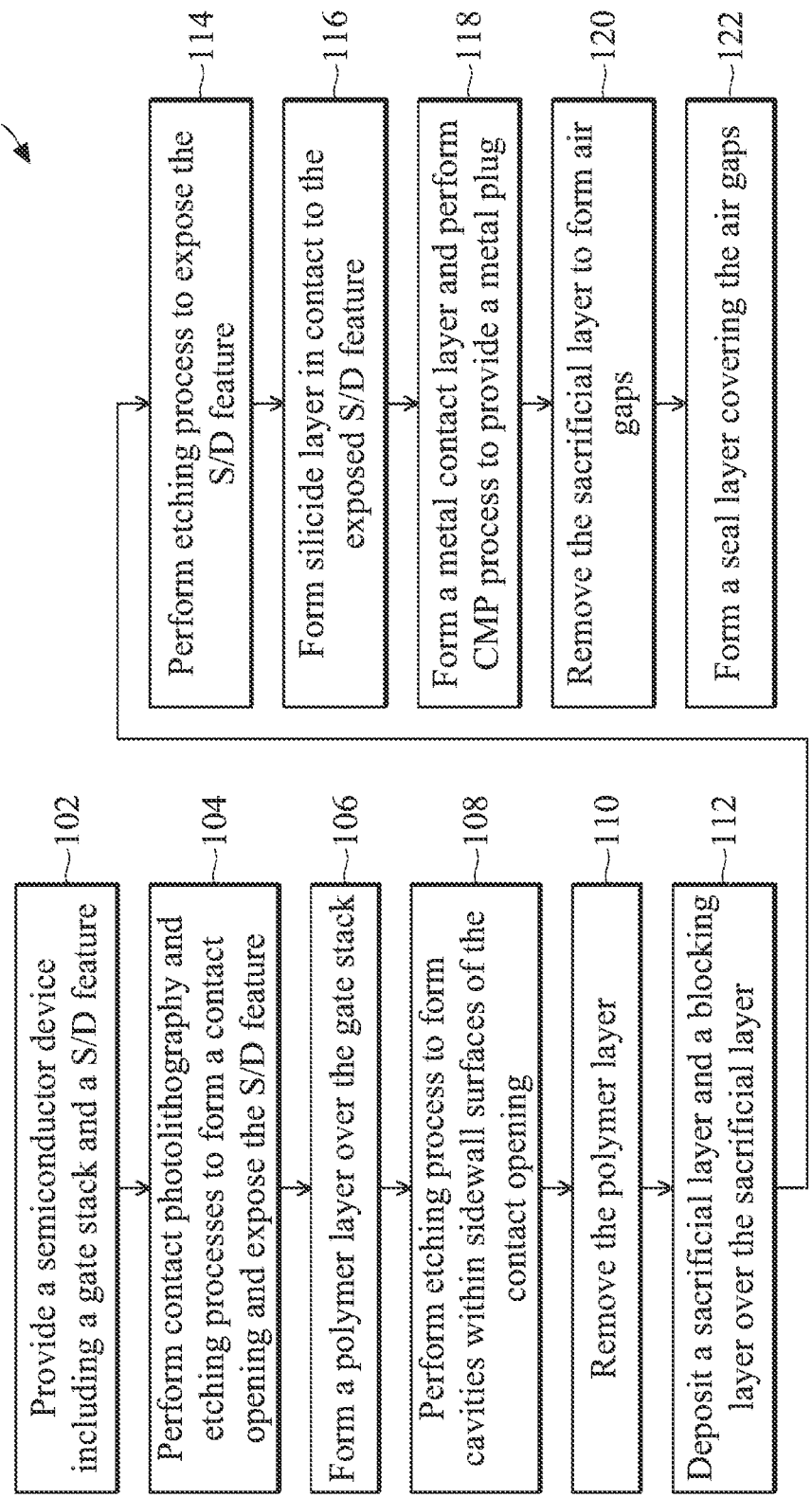
FIG. 1 is a flow chart showing a method for forming a semiconductor device, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to semiconductor devices and fabrication methods, and more particularly to the formation of air gaps between source/drain (S/D) contact structures and nearby metal gates. In some instances, the S/D contact structures have a circular shape, an oval shape, or a rectangular shape with respect to a top view. For purposes of this disclosure, the S/D contact structures may also be referred to as contact features, contact plugs, metal plugs, vias, via plugs, or metal contacts. As FinFET technologies progress towards smaller technology nodes, decreasing fin pitch is placing significant constraints on materials that can be used between metal gates and neighboring contact plugs that are connected to S/D features (e.g., such as epitaxial S/D features). To minimize coupling capacitance between the metal gates and contact plugs, air gaps can help reduce coupling capacitance because air has a lower dielectric constant (k=1) than other dielectric materials. However, when air gaps are formed prior to contact plugs, the air gaps are prone to damage by the subsequent formation of the contact plugs. For example, when forming a contact plug, overlay shift may occur if a mask for patterning the contact plug is not aligned perfectly with lower layer components. With overlay shift, the position of a contact hole may be very close to, if not touching, a neighboring metal gate. In this case, etching the contact hole would expose an already-sealed air gap, and the exposed air gap may be partially or completely filled by a nitride liner, which is formed after the etching of the contact hole. The air gap then loses its purpose of reducing coupling capacitance.

Embodiments of the present disclosure offer advantages over the existing art, though it is understood that other embodiments may offer different advantages, not all advantages are necessarily discussed herein, and no particular advantage is required for all embodiments. For example, embodiments discussed herein mitigate various shortcomings of existing methods by forming air gaps after (not before or simultaneous with) the formation of contact plugs. For example, air gaps are formed by selectively removing dummy features, which are disposed next to contact plugs. Selective removal of the dummy features is realized by etch selectivity of dummy feature material(s) compared to other materials in direct contact with the dummy features. In addition, post-contact plug formation of air gaps as disclosed herein provides self-aligned air gaps because the air gap locations are determined by the locations of the dummy features. In at least some prior implementations, air gaps adjacent to contact plugs provided limited room to insert an additional sacrificial layer without shrinking a contact metal dimension (e.g., such as a Co contact metal dimension). In such a case, device effective capacitance (Ceff) may decrease but effective resistance (Reff) may increase. In accordance with embodiments of the present disclosure, an aggressive push contact air gap spacer may be formed by utilizing a polymer capped dry etching method (e.g., similar to S/D dry etching proximity push) to form a larger air gap spacer (e.g., larger volume air gap) and increase a contact metal CD (e.g., such as a Co contact metal CD), thereby simultaneously improving capacitance and resistance. As a result, coupling capacitance between metal stacks and contact plugs can be effectively reduced. More generally, the various embodiments disclosed herein provide for improved Ceff and Reff, remove the risk of a metal gate-to-S/D contact metal short, and provide for a controllable air gap volume and an improved air gap seal. Additional details of embodiments of the present disclosure are provided below, and additional benefits and/or other advantages will become apparent to those skilled in the art having benefit of the present disclosure.

Referring now to FIG. 1, illustrated is a flow chart of a method 100 for forming a device 200 including a contact air gap, in accordance with some embodiments. The method 100 is described below in more detail with reference to FIGS. 2-14, which illustrate cross-section views of the device 200 at various stages of fabrication. It will be understood that additional process steps may be implemented before, during, and after the method 100, and some process steps described may be replaced or eliminated in accordance with various embodiments of the method 100. It will be further understood that parts of the method 100 may be fabricated by a well-known complementary metal-oxide-semiconductor (CMOS) technology process flow, and thus some processes are only briefly described herein.

In some embodiments, the device 200 may be or include a FinFET device (a fin-based transistor), which can be included in a microprocessor, memory cell, and/or other IC device. The device 200 may be an intermediate device fabricated during processing of an IC chip, a system on chip (SoC), or other type of chip or portion thereof, that includes various passive and active semiconductor devices such as resistors, capacitors, inductors, diodes, P-type transistors, N-type transistors, MOS transistors, CMOS transistors, bipolar transistors, high or low voltage transistors, high frequency transistors, strained-semiconductor devices, silicon-on-insulator (SOI) devices, partially-depleted SOI devices, fully-depleted SOI devices, or other suitable devices or components, or combinations thereof. One of ordinary skill may recognize other embodiments of semiconductor devices or components that may benefit from aspects of the present disclosure. Moreover, any of a plurality of semiconductor circuits and/or devices may be connected by interconnects formed during a BEOL process. It is also noted that FIGS. 2-14 have been simplified for the sake of clarity to better understand the inventive concepts of the present disclosure. Additional features can be added to the device 200, and some of the features described below can be replaced, modified, or eliminated in other embodiments of the device 200.

Figure 2:
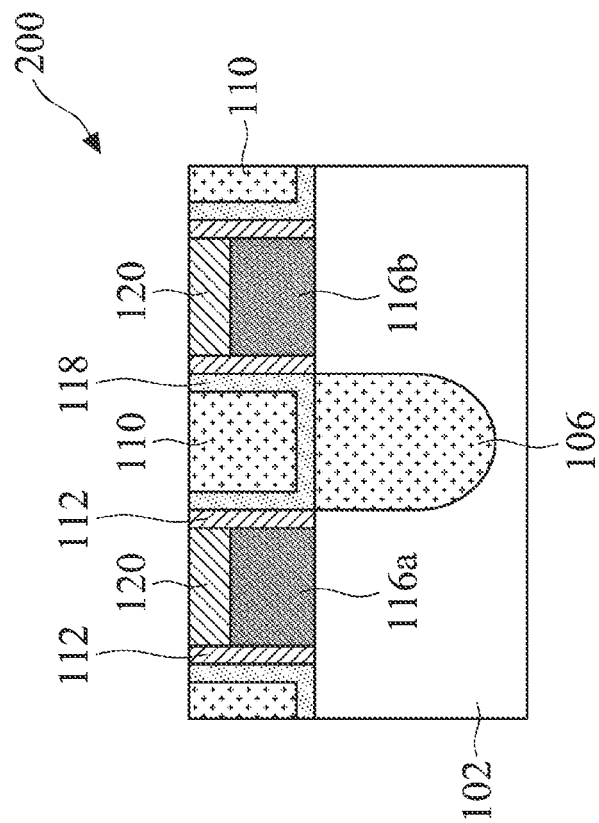

The method 100 begins at block 102 where the device 200 including a gate stack and a S/D feature is provided. With reference to FIG. 2, in an embodiment of block 102, the device 200 is provided, where the device 200 includes a substrate 102, a source or drain (S/D) feature 106, an ILD layer 110, gate spacers 112, gate stacks 116a and 116b, a contact etch stop layer (CESL) 118, and a hard mask (HM) layer 120.

The substrate 102 may include a semiconductor substrate such as a silicon substrate. The substrate 102 may include various layers, including conductive or insulating layers formed on a semiconductor substrate. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include an SOI structure, and/or the substrate 102 may have other suitable enhancement features.

In examples where the device 200 includes a FinFET device, the substrate 102 may include one or more fin elements extending therefrom. The one or more fin elements, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof.

In various embodiments, the S/D feature 106 is disposed within the substrate 102 and may include n-type doped silicon for NFETs, p-type doped silicon germanium for PFETs, or other suitable materials. The S/D feature 106 may be formed by etching openings in an active region adjacent to the gate spacers 112, and then epitaxially growing semiconductor materials in the openings. The epitaxially grown semiconductor materials may be doped in-situ or ex-situ. The S/D feature 106 may have any suitable shape and may be wholly or partially embedded within the substrate 102. For example, depending on an amount of epitaxial growth, the S/D feature 106 may rise above, be at the same level as, or remain below a top surface of the substrate 102. In examples where the device 200 includes a FinFET device and depending on the amount of epitaxial growth, the S/D feature 106 may rise above, be at the same level as, or remain below a top surface of the fin.

Gate stacks 116a and 116b may each include a gate dielectric layer and a metal layer formed over the gate dielectric layer. In some embodiments, the gate dielectric layer may include an interfacial layer formed over a channel region of the device 200 underlying the gate stacks 116a/116b and a high-K dielectric layer formed over the interfacial layer. The interfacial layer may include a dielectric material such as silicon oxide layer ($SiO_2$) or silicon oxynitride (SiON). The high-K dielectric layer may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer may include silicon dioxide or another suitable dielectric. The gate dielectric layer may be formed by chemical oxidation, thermal oxidation, atomic layer deposition (ALD), physical vapor deposition (PVD), chemical vapor deposition (CVD), and/or other suitable methods. The metal layer, formed over the gate dielectric layer, may include a conductive layer such as W, TiN, TaN, WN, Re, Ir, Ru, Mo, Al, Cu, Co, Ni, combinations thereof, and/or other suitable compositions. In some embodiments, the metal layer may include a first group of metal materials for N-type devices (e.g., N-type FinFETs) and a second group of metal materials for P-type device (e.g., P-type FinFETs). Thus, the device 200 may include a dual workfunction metal gate configuration. In some embodiments, the metal layer may alternately include a polysilicon layer. The metal layer may be formed using PVD, CVD, electron beam (e-beam) evaporation, and/or other suitable process.

Gate stacks 116a and 116b may be formed by any suitable processes such as a gate-first process and a gate-last process. In an example gate-first process, various material layers are deposited and patterned to form the gate stacks 116a and 116b before the S/D feature 106 is formed. In an example gate-last process (also called a gate replacement process), temporary gate structures (sometimes called "dummy" gates) are formed first. Then, after the S/D feature 106 is formed, the temporary gate structures are removed and replaced with gate stacks 116a and 116b.

In various examples, the HM layer 120 may be formed over the gate stacks 116a and 116b. In some embodiments, the HM layer 120 includes an oxide layer (e.g., $SiO_2$) and a nitride layer (e.g., $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique.

In some embodiments, the gate spacers 112 are formed on sidewalls of the gate stacks 116a/116b and the HM layer 120. The gate spacers 112 may include a dielectric material such as silicon oxide, silicon nitride, silicon carbide, silicon oxynitride, or combinations thereof. Further, the gate spacers 112 may include a single layer or multi-layer structure. In various embodiments, the gate spacers 112 may be formed by deposition (e.g., CVD or PVD) and etching processes.

The CESL 118 is disposed adjacent to the gate spacers 112 and, in some examples, over the S/D feature 106. In some embodiments, the CESL 118 may include silicon nitride, silicon oxide, silicon oxynitride (SiON), and/or other materials. The CESL 118 may be formed by one or more methods such as PECVD, ALD, and/or other suitable methods. In some embodiments, the ILD layer 110 is formed over the CESL 118 and may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. In various embodiments, the ILD layer 110 may be formed by FCVD, PECVD, or other suitable methods.

Figure 3:
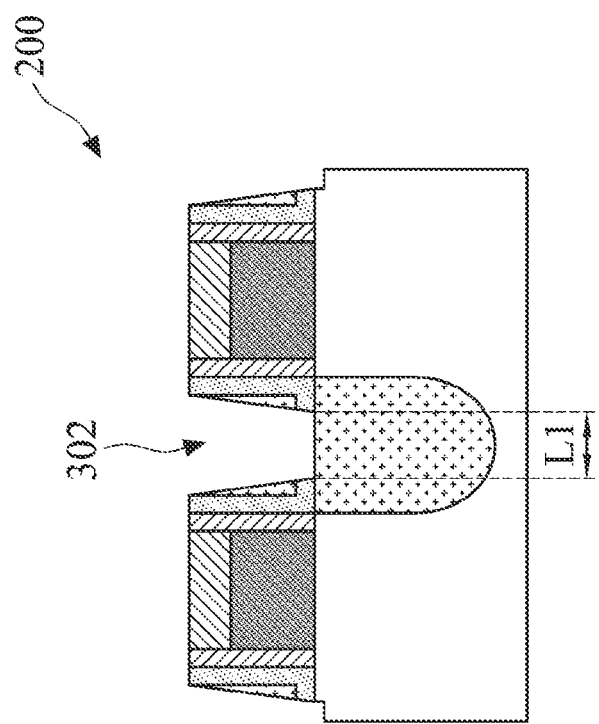
FIGS. 2, 3, 4, 5, 6, 7, 8, 9, 10, 11, 12, 13, and 14 provide cross-sectional views of a semiconductor device during various stages of processing, according to various embodiments of the present disclosure.

The method 100 proceeds to block 104 where contact photolithography (photo) and etching processes are performed to form a contact opening and expose the S/D feature. With reference to FIGS. 2 and 3, in an embodiment of block 104, performing the contact photo step may include forming a resist layer over the device 200 (FIG. 2), exposing the resist to a pattern (e.g., using a contact opening mask), performing post-exposure bake processes, and developing the resist to form a patterned resist layer over the device 200. In some embodiments, after formation of the patterned resist layer, the contact etching process may be performed to form a contact opening 302 (FIG. 3) that exposes a portion 'L1' of the S/D feature 106. In some examples, the contact etching process may include a wet etch, a dry etch, or a combination thereof. In some embodiments, after forming the contact opening 302, the patterned resist layer may be removed by way of a solvent, resist stripper, ashing, or other suitable technique. It is noted that formation of the contact opening 302, for example by the contact etching process, etches the ILD layer 110 and the CESL 118.

Figure 4:
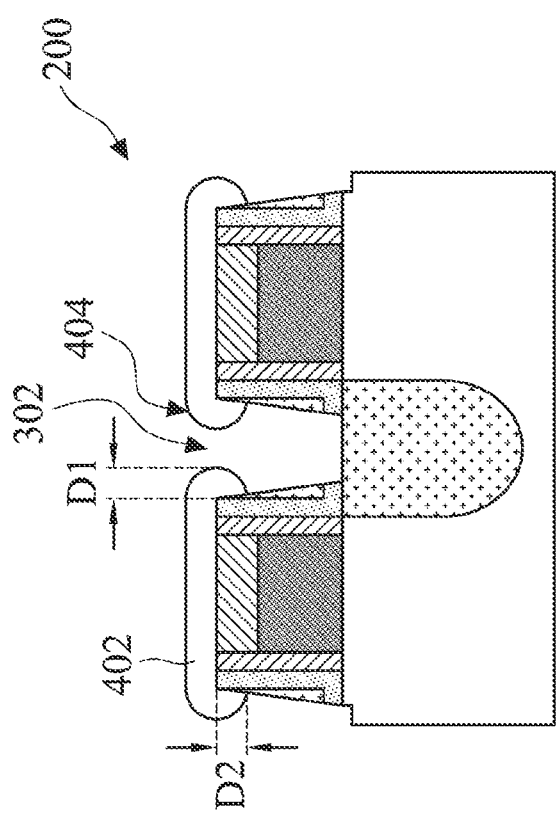

The method 100 proceeds to block 106 where a polymer layer is formed over the gate stack. With reference to FIGS. 3 and 4, in an embodiment of block 106, a polymer layer 402 may be formed over the gate stacks 116a and 116b. More particularly, and as shown in FIG. 4, the polymer layer 402 may be formed over the HM layer 120, over the gate spacers 112, and over a portion of the CESL 118 adjacent to and in contact with the gate spacers 112 such that the polymer layer 402 overhangs the gate stacks 116a/116b (e.g. by overhanging the gate spacers 112/CESL 118) to form overhang regions 404. In the illustrated example, the overhang of the polymer layer 402 results in formation of the polymer layer 402 on at least a portion of sidewall surfaces of the contact opening 302. In some embodiments, a size of the overhang region 404 may include a distance 'D1' by which the polymer layer 402 extends into the contact opening 302, for example, at the top of the contact opening 302. In some cases, the size of the overhang region 404 may include a distance 'D2' which defines the portion of a sidewall surface of the contact opening 302 covered by the polymer layer 402. In some examples, the polymer layer 402 has a thickness of about 5-20 nm, where the thickness of the polymer layer 402 may at least partly determine the size of the overhang region 404 (e.g., such as the distance 'D1' and/or the distance 'D2'). In various examples, the polymer layer 402 may include carbon [CFx+] based polymers, poly (methyl methacrylate) (PMMA), or fluoropolymers such as perfluoroalkoxy alkane (PFA). The polymer layer 402 may also include a single polymer, multi-polymer blend, or monomer-polymer blend. In addition, in some cases, the polymer layer 402 may include various functional groups such as a chelating functional groups or other appropriate functional groups. In some embodiments, the polymer layer 402 may be formed using a variety of methods such as by a spin-coating process, a vapor deposition process, or other appropriate process. In some embodiments, a baking process may be performed to remove solvents from the polymer layer 402. The polymer layer 402 may be removed at a subsequent stage, as described below, for example by using an appropriate solvent, wet etch, an ashing process, or a combination thereof.

Figure 5:
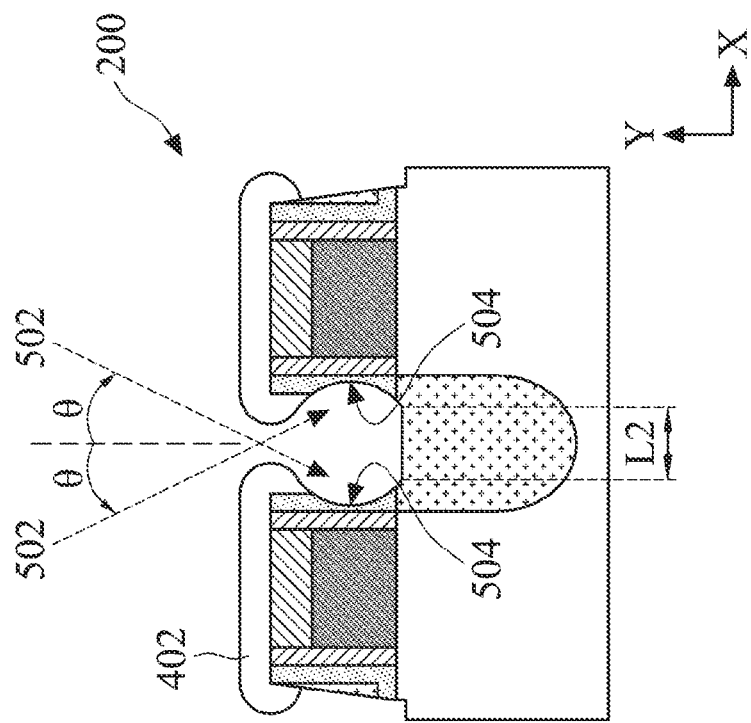

The method 100 proceeds to block 108 where an etching process is performed to form cavities within sidewall surfaces of the contact opening. With reference to FIGS. 4 and 5, in an embodiment of block 108, an etching process 502 may be performed to form cavities 504 in the sidewall surfaces of the contact opening 302. In some embodiments, the etching process 502 may include a dry etching process such as a reactive ion etching (RIE) process or other appropriate etching process. The etching process 502 may be performed using a variety of chemical species such as fluorine, chlorine, oxygen, or other appropriate species, and in some cases may be optimized to etch one or both of the CESL 118 and the gate spacers 112. Additionally, by way of example, the etching process 502 may be performed at a tilt angle Θ, as measured with respect to a plane normal to the surface of the device 200. In some embodiments, the tilt angle Θ is less than about 45 degrees. In some cases, the tilt angle Θ is within a range of about 30-45 degrees. In various embodiments, profiles of the cavities 504 may be determined by a size of the overhang region 404, as described above, and the tilt angle Θ of the etching process 502. In addition, profiles of the cavities 504 may be tailored to control the dimensions of the subsequently formed air gap spacers. Further, in various embodiments, the profiles of the cavities 504 may include a curved sidewall profile. In some cases, and due to the curved sidewall profile of the cavities 504, a width (e.g., along an X-direction, FIG. 5) of the subsequently formed air gap spacers may vary as a function of depth (e.g., Y-direction, FIG. 5). For example, a width of a middle portion of the air gap spacers may be greater than a width of a top or bottom portion of the air gap spacers.

Moreover, in accordance with various embodiments and as described in more detail below, the cavities 504 may be subsequently used for the formation of larger air gap spacers (e.g., larger volume air gap), as described below. Also, formation of the cavities 504 may expose a portion 'L2' of the S/D feature 106, where the portion 'L2' is larger than the portion 'L1' of the S/D feature 106 originally exposed during formation of the contact opening 302 (FIG. 3). As such, formation of the cavities 504 also provides for increased contact metal CD (e.g., such as a Co contact metal CD). Thus, formation of the cavities 504 provides for simultaneously improving capacitance and resistance of the device 200.

Figure 6:
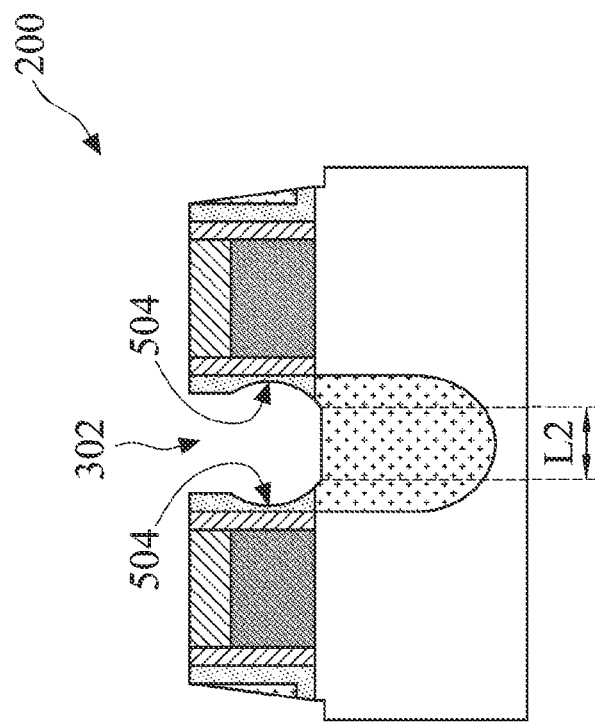

After formation of the cavities 504, the method 100 proceeds to block 110 where the polymer layer is removed. With reference to FIGS. 5 and 6, in an embodiment of block 110, the polymer layer 402 may be removed using an appropriate solvent, wet etch, an ashing process, or by a combination thereof.

Figure 7:
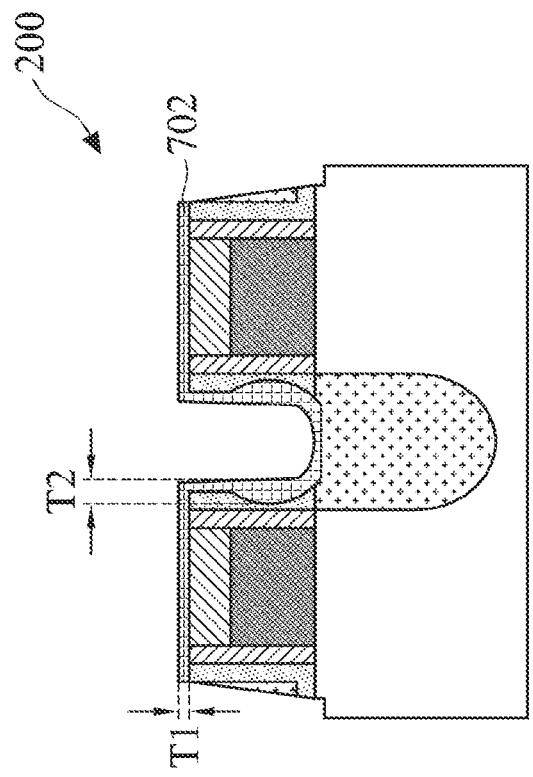
Figure 8:
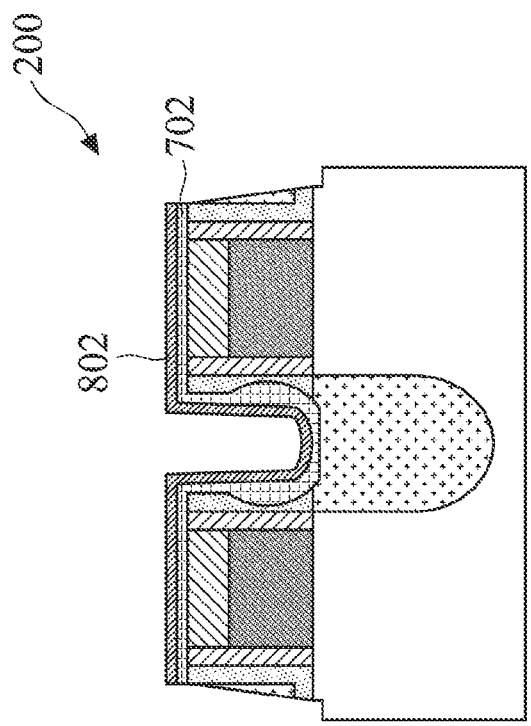

The method 100 then proceeds to block 112 where a sacrificial layer and a blocking layer are deposited. With reference to FIGS. 6-8, in an embodiment of block 112, a sacrificial layer 702 (FIG. 7) is deposited over the device 200. In particular, the sacrificial layer 702 is deposited over top surfaces of the device (e.g., over the HM layer 120, the gate spacers 112, and the CESL 118), as well as over a bottom surface and sidewall surfaces of the contact opening 302, including within the cavities 504 such that the cavities 504 are substantially filled by the sacrificial layer 702. In some cases, the sacrificial layer 702 includes silicon, germanium, silicon germanium (SiGe), low density silicon nitride, low density silicon oxide, and/or other suitable materials. Since the sacrificial layer 702 is to be selectively etched later to form air gaps (at block 120), the composition of the sacrificial layer 702 may be tailored or optimized for such a selective etching process. In various examples, the sacrificial layer 702 may be formed by one or more methods such as PECVD, ALD, and/or other suitable deposition or oxidation processes.

In various embodiments, a thickness of the sacrificial layer 702 may be tailored, in addition to the profiles of the cavities 504 (discussed above), to control the dimensions of the subsequently formed air gap spacers. In some examples, and still with reference to FIG. 7, the sacrificial layer 702 has a first thickness 'T1' (e.g., along top surfaces of the HM layer 120, gate spacers 112, and CESL 118, and along a portion of a sidewall surface of the contact opening 302 previously covered by the overhang regions 404 of the polymer layer 402, such as shown in FIG. 4). In some embodiments, 'T1' may be in a range of about 1-6 nm, for example, to ensure that the sacrificial layer 702 is continuous and to provide a sufficient process window for subsequently formed features (e.g., such as metal plug 1102A, discussed below). The sacrificial layer 702 also has a second thickness 'T2' of the sacrificial layer 702 (e.g., along the cavities 504). The second thickness 'T2' may vary, for example, based on where along the sidewall of the contact opening 302 the thickness 'T2' is measured. Nevertheless, due to the cavities 504, the second thickness 'T2' will generally be greater than the first thickness 'T1'. In some embodiments, 'T2' may be in a range of about 2-10 nm, for example, to provide an increased volume air gap spacer as compared to at least some existing processes, while maintaining contact metal CD.

In prior implementations (e.g., without the cavities 504), the sacrificial layer 702 had to be thick enough to provide a sufficient air gap spacer but thin enough to allow sufficient volume to form a reliable metal contact feature within the contact opening 302. As such, at least some prior methods provided limited room to insert an additional sacrificial layer, or increase the thickness of an existing sacrificial layer, without shrinking a contact metal dimension. In contrast, by providing the cavities 504, embodiments of the present disclosure provide a way to effectively increase the thickness of the sacrificial layer 702 (e.g., along a portion of the sidewall of the contact opening 302 including the cavities 504), thus providing for a larger volume air gap spacer (as described below), while maintaining an increased contact metal CD.

In a further embodiment of block 112, a blocking layer 802 (FIG. 8) is deposited over the sacrificial layer 702. In some embodiments, the blocking layer 802 includes a nitride-containing layer such as carbon-doped SiN, high-density SiN, and/or other suitable materials. In various cases, the blocking layer 802 may have a thickness in a range of about 1-6 nm. In some examples, the blocking layer 802 may be formed by one or more methods such as PECVD, ALD, and/or other suitable processes. In some embodiments, the blocking layer 802 includes a thin layer with a generally conformal thickness across the device 200. In particular, the conformal quality of the blocking layer 802 along sidewalls of the contact opening 302 helps to avoid a current leakage path from a subsequently formed contact plug (e.g., formed at block 118) to gate stacks 116a and 116b, or vice versa.

Figure 9:
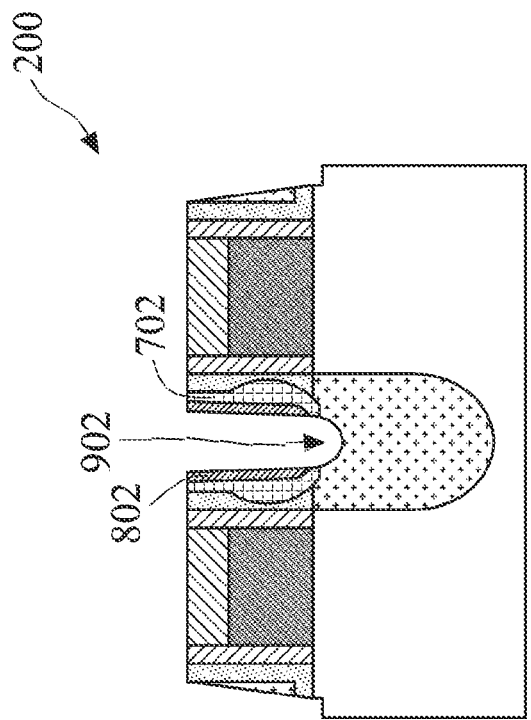

The method 100 then proceeds to block 114 where an etching process is performed to expose the S/D feature. With reference to FIGS. 8 and 9, in an embodiment of block 114, the etching process may include a wet etch, a dry etch, or a combination thereof that substantially removes the blocking layer 802 and the sacrificial layer 702 from a top surface of the gate structures (e.g., top surface of the HM layer 120, the gate spacers 112, and the CESL 118), while also removing the blocking layer 802 and the sacrificial layer 702 from at least a portion of the S/D feature 106 to form a cavity 902 that exposes the S/D feature 106. In some embodiments, the etching process may also etch a portion of the S/D feature 106 during formation of the cavity 902. It is noted after the etching process of block 114, the blocking layer 802 and the sacrificial layer 702 may substantially remain on sidewalls of the contact opening 302, including within the cavities 504.

Figure 10:
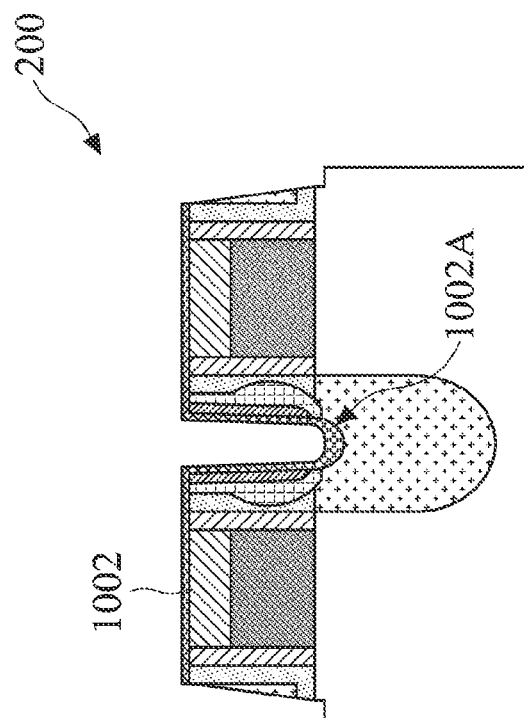

The method 100 then proceeds to block 116 where a silicide layer is formed in contact to the exposed S/D feature. With reference to FIGS. 9 and 10, in an embodiment of block 116, a metal layer 1002 is formed over the device 200 including within the cavity 902 such that the metal layer 1002 contacts the S/D feature 106. In various embodiments, the metal layer 1002 may generally cover the bottom and sidewall surfaces of the contact opening 302, as well as the top surface of the gate structures (e.g., top surface of the HM layer 120, the gate spacers 112, and the CESL 118). In some cases, the metal layer 1002 may be deposited using ALD, CVD, PVD, or other appropriate process. By way of example, the metal layer 1002 may include various material(s) such as nickel (Ni), cobalt (Co), tungsten (W), tantalum (Ta), or titanium (Ti), combinations thereof, or other suitable material. After formation of the metal layer 1002, and in a further embodiment of block 116, the device 200 may be annealed to raise the temperature of the metal layer 1002 so that the metal layer 1002 reacts with semiconductor material(s) in the S/D feature 106 to form a metal silicide 1002A. In some embodiments, non-reacted portions of the metal layer 1002 (e.g., along sidewall surfaces of the contact opening 302 and on the top surface of the gate structures) may be removed (e.g., by a wet or dry etching process), thus leaving the metal silicide 1002A in contact with the S/D feature 106. In various embodiments, the metal silicide 1002A may include nickel silicide, cobalt silicide, titanium silicide, or other suitable materials.

Figure 11:
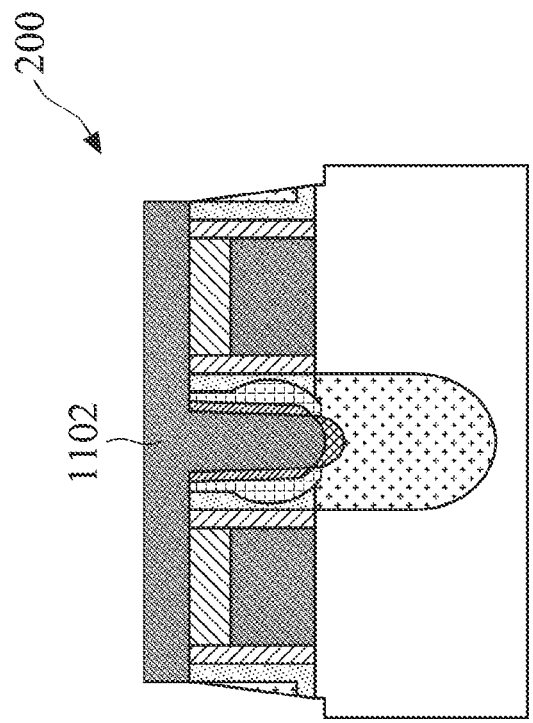
Figure 12:
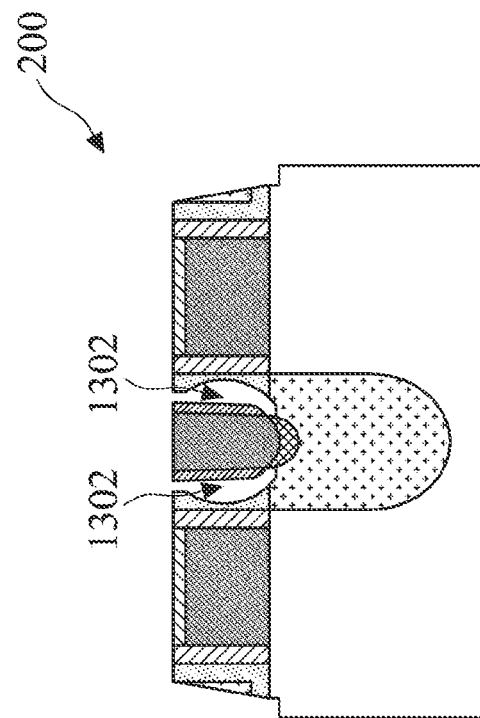

The method 100 then proceeds to block 118 where a metal contact layer is formed, and a CMP process is performed to provide a metal plug. With reference to FIGS. 11 and 12, in an embodiment of block 118, a metal contact layer 1102 is formed over the device 200. In some embodiments, the metal contact layer 1102 includes aluminum (Al), tungsten (W), copper (Cu), cobalt (Co), titanium (Ti), nitrogen (N), ruthenium (Ru), combinations thereof, or other suitable materials. In some cases, the metal contact layer 1102 may also include a barrier layer made of a conductive nitride such as TaN or TiN. In various examples, the metal contact layer 1102 may be formed by PVD, CVD, ALD, plating, or other suitable methods. The metal contact layer 1102 is electrically coupled to the S/D feature 106 through the metal silicide 1002A. However, in an alternative embodiment, the metal contact layer 1102 may be directly connected to the S/D feature 106 without an intermediate silicide feature. After formation of the metal contact layer 1102, and in a further embodiment of block 118, a chemical mechanical planarization (CMP) process is performed to remove an excess portion of the metal contact layer 1102 and planarize a top surface of the device 200, thus providing a metal plug 1102A. In various examples, the metal plug 1102A may be alternatively referred to as a contact plug, a via, a via plug, or a metal contact. It is also noted that the CMP process of block 118 is configured to expose a top surface of the sacrificial layer 702 (e.g., for subsequent formation of the air gaps). Further, the CMP process may also expose a top surface of the blocking layer 802 and a top surface of the gate structures (e.g., top surfaces of the HM layer 120, the gate spacers 112, and the CESL 118).

Figure 13:
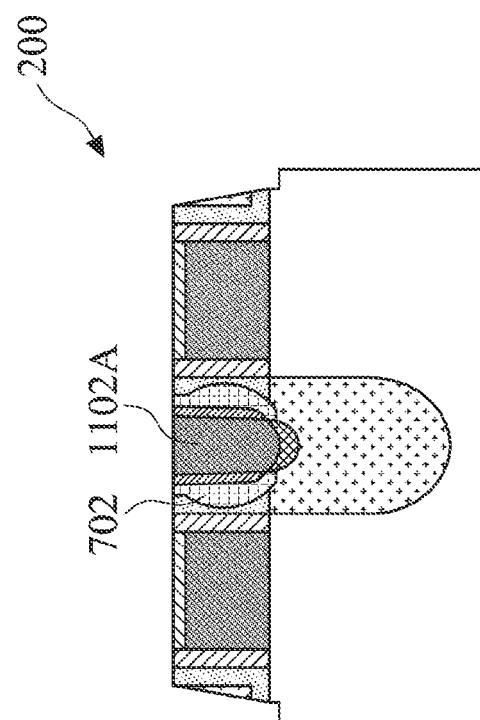

The method 100 then proceeds to block 120 where the sacrificial layer is removed to form air gaps. With reference to FIGS. 12 and 13, in an embodiment of block 120, remaining portions of the sacrificial layer 702 (exposed by the CMP process of block 118) are removed to form air gaps 1302. In some embodiments, the sacrificial layer 702 may be removed using a selective etching process. The selective etching process may include dry etching, wet etching, an RIE process, and/or other suitable processes. By way of example, the air gaps 1302 are formed between the metal plug 1102A and adjacent gate stacks 116a/116b to reduce a capacitance therebetween. The capacitance is reduced because air has a dielectric constant (k) of about one, which is lower than other dielectric materials. Moreover, by forming the cavities 504 as described above and thus causing the sacrificial layer 702 to occupy a greater volume, the air gaps 1302 formed at block 120 will also occupy a greater volume and reduce the capacitance even further (e.g., as compared to at least some existing implementations). In some embodiments (e.g., when there is no overlay shift), the air gaps 1302 on each side of the metal plug 1102A may have substantially similar dimensions, and thus their respective capacitances may be about equal. However, if there is overlay shift, the air gaps 1302 on each side of the metal plug 1102A may have different dimensions, and thus their respective capacitances may be different. Nevertheless, because of the increased volume air gaps 1302 and associated reduced capacitance, any impact on device or circuit performance because of the variation in capacitances on either side of the metal plug 1102 (e.g., due to overlay shift) may be largely mitigated. Also, because of the curved sidewall profile of the cavities 504 as described above, a width of the air gaps 1302 may vary as a function of depth. For example, a width of a middle portion of the air gaps 1302 may be greater than a width of a top or bottom portion of the air gaps 1302.

Figure 14:
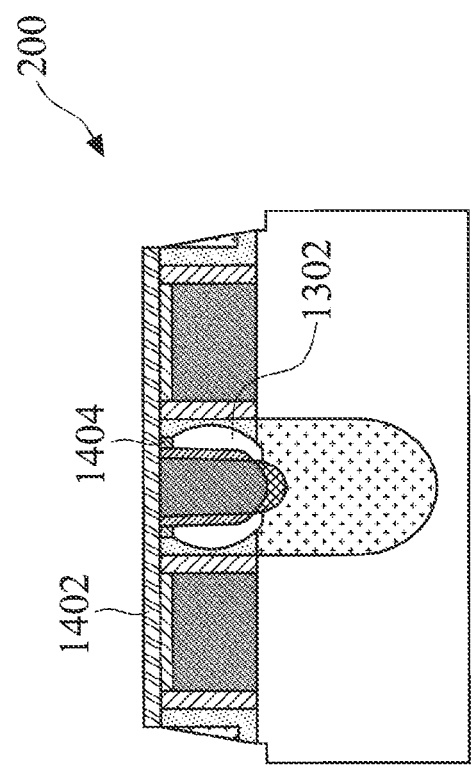

The method 100 then proceeds to block 122 where a seal layer is formed to cover the air gaps. With reference to FIGS. 13 and 14, in an embodiment of block 122, a seal layer 1402 is formed over the device 200 such that the seal layer 1402 covers, and thus seals, the air gaps 1302. In some embodiments, the seal layer 1402 includes SiN, SiON, SiCN, SiOCN, or other appropriate materials. In various embodiments, the seal layer 1402 may be deposited using CVD, PVD, ALD, PECVD, and/or other suitable methods. In some embodiments, the seal layer 1402 may have a thickness of about 3-8 nm. By way of example, the seal layer 1402 may use any suitable material as long as it ensures full enclosure of the air gaps 1302 to prevent other materials from getting into the air gaps 1302. Upon formation of the seal layer 1402, the volumes of the air gaps 1302 are finalized and air gap spacer formation for the device 200 is complete. In some embodiments, the seal layer 1402 may slightly penetrate into the air gaps 1302 (e.g., for 1-4 nm), for example, as indicated by element 1404. However, in general, a top surface opening of the air gaps 1302 may have very small width(s) (e.g., no more than 10 nm, 5 nm, 3 nm, or 2 nm) such that there is no risk of the seal layer 1402 penetrating deeply into the air gaps 1302.

The device 200 may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein mitigate various shortcomings of existing methods by forming air gaps after (not before or simultaneous with) the formation of contact plugs. In some embodiments, air gaps are formed by selectively removing dummy features, which are disposed next to contact plugs. Selective removal of the dummy features is realized by etch selectivity of dummy feature material(s) compared to other materials in direct contact with the dummy features. In addition, post-contact plug formation of air gaps as disclosed herein provides self-aligned air gaps because the air gap locations are determined by the locations of the dummy features. In some examples, a contact air gap spacer may be formed by utilizing a polymer capped dry etching method (e.g., similar to S/D dry etching proximity push) to form a larger air gap spacer (e.g., larger volume air gap) and increase a contact metal CD (e.g., such as a Co contact metal CD), thereby simultaneously improving capacitance and resistance. As a result, coupling capacitance between metal stacks and contact plugs can be effectively reduced. More generally, the various embodiments disclosed herein provide for improved Ceff and Reff, remove the risk of a metal gate-to-S/D contact metal short, and provide for a controllable air gap volume and an improved air gap seal. Additional embodiments and advantages will be evident to those skilled in the art in possession of this disclosure.

Thus, one of the embodiments of the present disclosure described a method where a first transistor including a first gate structure and a source/drain structure adjacent to the first gate structure is provided. In some embodiments, a cavity is formed along a sidewall surface of a contact opening disposed over the source/drain structure. After forming the cavity, a sacrificial layer is deposited over a bottom surface and along the sidewall surface of the contact opening including within the cavity, where the cavity is filled with the sacrificial layer. In some cases, a first portion of the sacrificial layer along the bottom surface of the contact opening is removed to expose a portion of the source/drain structure. A metal plug is then formed over the portion of the exposed source/drain structure. In some embodiments, a remaining portion of the sacrificial layer is removed to form an air gap disposed between the metal plug and the first gate structure. Thereafter, a seal layer is deposited over the air gap to form an air gap spacer.

In another of the embodiments, discussed is a method that includes providing a first transistor having a first gate structure, a second transistor including a second gate structure, a source/drain structure disposed between and adjacent to each of the first and second gate structures, and a contact opening disposed over the source/drain structure. In some embodiments, a first cavity is formed in a first sidewall surface of the contact opening and a second cavity is formed in a second sidewall surface of the contact opening. In some examples, a sacrificial layer is deposited along the first sidewall surface and along the second sidewall surface including within the first cavity and the second cavity. In various embodiments, a metal plug is formed over the source/drain structure. The metal plug is disposed between the sacrificial layer along the first sidewall surface and the sacrificial layer along the second sidewall surface. After forming the metal plug, the sacrificial layer is removed from the first sidewall surface and the second sidewall surface to form a first air gap disposed between the metal plug and the first gate structure and a second air gap disposed between the metal plug and the second gate structure. In some embodiments, a seal layer is deposited over the first air gap and the second air gap to form air gap spacers adjacent to the metal plug.

In yet another of the embodiments, discussed is a semiconductor device including a gate structure and a source/drain structure adjacent to the gate structure. The semiconductor device further includes a metal plug disposed over the source/drain structure and adjacent to the gate structure. In some examples, the semiconductor device also includes an air gap spacer having a seal layer formed over a cavity, where the air gap spacer is disposed between the metal plug and the gate structure, and where the cavity includes a curved sidewall profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a polymer layer that overhangs a gate structure to form an overhang region, wherein a source/drain structure is adjacent to the gate structure;
   performing a dry etching process at a tilt angle to form a cavity along a sidewall surface of a contact opening disposed over the source/drain structure, wherein the cavity has a curved sidewall profile that is at least partially defined by the overhang region and the tilt angle;
   after forming the cavity, removing the polymer layer and depositing a sacrificial layer within the cavity;
   after forming a metal plug over the source/drain structure, selectively etching the sacrificial layer to form an air gap adjacent to the metal plug; and
   sealing the air gap to form an air gap spacer.

2. The method of claim 1, wherein the depositing the sacrificial layer includes depositing the sacrificial layer along a bottom surface and along the sidewall surface of the contact opening, the sidewall surface including the cavity, and wherein the method further comprises:
   removing a first portion of the sacrificial layer from the bottom surface of the contact opening to expose a portion of the source/drain structure; and
   forming the metal plug over the exposed portion of the source/drain structure.

3. The method of claim 2, wherein the selectively etching the sacrificial layer to form the air gap includes removing a remaining portion of the sacrificial layer after formation of the metal plug.

4. The method of claim 1, wherein the sealing the air gap includes depositing a seal layer over the air gap.

5. The method of claim 1, wherein the overhang region covers at least a portion of the sidewall surface of the contact opening.

6. The method of claim 2, wherein the sacrificial layer has a first thickness along the sidewall surface of the contact opening, wherein the sacrificial layer has a second thickness over the gate structure, and wherein the first thickness is greater than the second thickness.

7. The method of claim 2, further comprising:
   prior to removing the first portion of the sacrificial layer, forming a blocking layer over the sacrificial layer; and removing the first portion of the sacrificial layer, and a first portion of the blocking layer, from the bottom surface of the contact opening to expose the portion of the source/drain structure.

8. The method of claim 2, further comprising:
after exposing the portion of the source/drain structure and prior to forming the metal plug, forming a silicide layer in contact with the portion of the exposed source/drain structure; and
forming the metal plug over the silicide layer.

9. The method of claim 1, wherein the performing the dry etching process to form the cavity along the sidewall surface of the contact opening increases a dimension of an exposed region of the source/drain structure.

10. The method of claim 1, wherein a first width of a middle portion of the air gap spacer is greater than a second width of a top or bottom portion of the air gap spacer.

11. A method, comprising:
providing a contact opening disposed between and adjacent to each of a first gate structure and a second gate structure;
forming a cavity along each sidewall surface of the contact opening, wherein the cavity has a curved profile having a width along a first direction that varies as a function of depth along a second direction;
forming a sacrificial layer within the cavity on each sidewall surface of the contact opening;
forming a metal contact within the contact opening and between each sidewall surface of the contact opening; and
etching the sacrificial layer to form air gaps between the metal contact and each of the first gate structure and the second gate structure, wherein the air gaps include the curved profile having the width along the first direction that varies as the function of depth along the second direction.

12. The method of claim 11, further comprising:
depositing a seal layer over the air gaps to form air gap spacers on either side of the metal contact.

13. The method of claim 11, further comprising:
prior to forming the cavity along each sidewall surface of the contact opening, depositing a first polymer layer that overhangs the first gate structure to form a first overhang region and a second polymer layer that overhangs the second gate structure to form a second overhang region.

14. The method of claim 13, wherein the first overhang region covers at least a first portion of a first sidewall surface of the contact opening, and wherein the second overhang region covers at least a second portion of a second sidewall surface of the contact opening.

15. The method of claim 11, further comprising:
prior to forming the metal contact, forming the sacrificial layer over a bottom surface and along each sidewall surface of the contact opening including within the cavity on each sidewall surface of the contact opening; and
removing a first portion of the sacrificial layer along the bottom surface of the contact opening to expose a portion of an underlying source/drain structure.

16. The method of claim 15, further comprising:
after exposing the portion of the underlying source/drain structure and prior to forming the metal contact, forming a silicide layer on the exposed portion of the underlying source/drain structure; and
forming the metal contact on the silicide layer.

17. The method of claim 11, wherein a first thickness of the sacrificial layer within the cavity along each sidewall surface of the contact opening is greater than a second thickness of the sacrificial layer disposed outside of the cavity along each sidewall surface of the contact opening.

18. A semiconductor device, comprising:
a spacer disposed adjacent to a gate stack, wherein a first side of the spacer contacts a first sidewall of the gate stack, and wherein a second side of the spacer contacts an etch stop layer;
a metal contact disposed adjacent to the etch stop layer; and
an air gap spacer interposing the etch stop layer and the metal contact;
wherein the etch stop layer includes a curved sidewall profile that defines a lateral surface of the air gap spacer.

19. The semiconductor device of claim 18, wherein the air gap spacer includes a seal layer formed over a cavity, and wherein the cavity includes the curved sidewall profile.

20. The semiconductor device of claim 18, further comprising:
a blocking layer disposed on a second sidewall of the metal contact, wherein the blocking layer is disposed between the metal contact and the air gap spacer.

* * * * *